United States Patent
Suzuki et al.

(10) Patent No.: US 10,983,052 B2
(45) Date of Patent: Apr. 20, 2021

(54) ELECTRICITY MEASURING TYPE SURFACE PLASMON RESONANCE SENSOR AND ELECTRICITY MEASURING TYPE SURFACE PLASMON RESONANCE SENSOR CHIP USED IN THE SAME

(71) Applicants: IMRA JAPAN KABUSHIKIKAISHA, Sapporo (JP); NATIONAL UNIVERSITY CORPORATION HOKKAIDO UNIVERSITY, Sapporo (JP)

(72) Inventors: Hironori Suzuki, Sapporo (JP); Giles Allison, Sapporo (JP); Masanori Sasaki, Sapporo (JP); Koki Hayashi, Sapporo (JP); Hiroaki Misawa, Sapporo (JP); Kosei Ueno, Sapporo (JP)

(73) Assignees: IMRA JAPAN KABUSHIKIKAISHA, Sapporo (JP); NATIONAL UNIVERSITY CORPORATION HOKKAIDO UNIVERSITY, Sapporo (JP)

( * ) Notice: Subject to any disclaimer, the term of this patent is extended or adjusted under 35 U.S.C. 154(b) by 0 days.

(21) Appl. No.: 16/473,369
(22) PCT Filed: Aug. 9, 2018
(86) PCT No.: PCT/JP2018/029979
  § 371 (c)(1),
  (2) Date: Jun. 25, 2019
(87) PCT Pub. No.: WO2019/031591
  PCT Pub. Date: Feb. 14, 2019

(65) Prior Publication Data
  US 2020/0182789 A1  Jun. 11, 2020

(30) Foreign Application Priority Data
  Aug. 10, 2017  (JP) .............................. JP2017-155187

(51) Int. Cl.
  *G01N 21/552*  (2014.01)
  *G01N 21/41*  (2006.01)
  (Continued)

(52) U.S. Cl.
  CPC ........... *G01N 21/553* (2013.01); *G01N 21/41* (2013.01); *H01L 31/0232* (2013.01); *H01L 31/108* (2013.01)

(58) Field of Classification Search
  CPC ...... G01N 21/41; G01N 21/553; G01N 27/00; H01L 31/0232; H01L 31/108
  (Continued)

(56) References Cited

U.S. PATENT DOCUMENTS 9,368,667 B1 * 6/2016 Kim .................... H01L 31/1136
2005/0048599 A1 * 3/2005 Goldberg ................. C12Q 1/18
  435/34

(Continued)

FOREIGN PATENT DOCUMENTS

EP  1860485 A1  11/2007
JP  2000-356587 A  12/2000
  (Continued)

OTHER PUBLICATIONS

Oct. 30, 2018 International Search Report issued in International Patent Application No. PCT/JP2018/029979.
(Continued)

*Primary Examiner* — Tri T Ton
(74) *Attorney, Agent, or Firm* — Oliff PLC

(57) ABSTRACT

An electricity measuring type surface plasmon resonance sensor including: a plasmon polariton intensifying sensor chip in which a prism and a sensor chip including a transparent electrode, an n-type transparent semiconductor film, and a plasmon resonance film electrode arranged in this order are arranged in an order of the prism, the transparent
(Continued)

electrode, the n-type transparent semiconductor film, and the plasmon resonance film electrode; and an electric measuring apparatus which directly measures a current or voltage from the transparent electrode and the plasmon resonance film electrode.

10 Claims, 9 Drawing Sheets

(51) Int. Cl.
   *H01L 31/0232*   (2014.01)
   *H01L 31/108*   (2006.01)
(58) Field of Classification Search
   USPC .................................. 356/445–448, 213–236
   See application file for complete search history.

(56) References Cited

U.S. PATENT DOCUMENTS

| 2010/0067016 A1* | 3/2010 | Ueno | ........................ | G01J 5/08 |
| | | | | 356/445 |
| 2010/0328671 A1 | 12/2010 | Baldo et al. | | |
| 2011/0114859 A1 | 5/2011 | Amako et al. | | |
| 2011/0116088 A1 | 5/2011 | Amako et al. | | |
| 2013/0229652 A1 | 9/2013 | Amako et al. | | |
| 2016/0178516 A1* | 6/2016 | Abdulhalim | ......... | G01N 21/554 |
| | | | | 356/364 |

FOREIGN PATENT DOCUMENTS

| JP | 2007-073794 A | 3/2007 |
| JP | 2008-053615 A | 3/2008 |
| JP | 2011-141265 A | 7/2011 |
| JP | 2011-171519 A | 9/2011 |
| JP | 2012-38541 A | 2/2012 |
| JP | 2012-58040 A | 3/2012 |
| JP | 2015-502658 A | 1/2015 |

OTHER PUBLICATIONS

Feb. 11, 2020 International Preliminary Report on Patentability issued in International Patent Application No. PCT/JP2018/029979.

* cited by examiner

ELECTRICITY MEASURING TYPE SURFACE PLASMON RESONANCE SENSOR AND ELECTRICITY MEASURING TYPE SURFACE PLASMON RESONANCE SENSOR CHIP USED IN THE SAME

TECHNICAL FIELD

The present invention relates to an electricity measuring type surface plasmon resonance sensor and an electricity measuring type surface plasmon resonance sensor chip used in the same.

BACKGROUND ART

Surface plasmon resonance (SPR) is a state in which free electrons are in collective oscillatory motion (plasma oscillation) on a metal surface, and is classified into propagating surface plasmon resonance (PSPR) which propagates over a metal surface and localized surface plasmon resonance (LSPR) which is localized at a metal structure in nanometer size. The propagating surface plasmon resonance is a state in which resonance is taking place due to the interaction between the incident light and the electric field produced around the free electrons under plasma oscillation, and an electron compression wave (surface plasmon polariton, SPP) formed by the coupling of the plasma oscillation and the electromagnetic wave traveling along the interface propagates along the metal surface. On the other hand, the localized surface plasmon resonance is a state in which the plasma oscillation polarizes and induces metal nanostructures such as the metal nanoparticles to generate electric dipoles.

The surface plasmon resonance is applied in sensors such as affinity sensors for detecting whether the target substance is adsorbed and the strength of interaction, and for example, Japanese Unexamined Patent Application Publication No. 2011-141265 (PTL 1) describes a sensor chip comprising: a substrate that has a planar portion; and a diffraction grating on the planar portion and having a metal surface, the diffraction grating having a target substance thereon and including a plurality of specific protrusions. However, since it is necessary to use an optical system to detect the change in surface plasmon resonance angle due to the change in the concentration of the target substance present on the metal surface, the sensor chip as described in PTL 1 has problems that the apparatus tends to be expensive or large in size and that it is difficult to achieve integration and a higher throughput achieving processing a large number of samples at the same time.

Moreover, Japanese Unexamined Patent Application Publication No. 2000-356587 (PTL 2) describes a localized plasmon resonance sensor comprising: a sensor unit which includes a substrate and metal fine particles fixed on a surface of the substrate in a membrane form where the particles do not cling to each other but are separated from each other. However, since the absorbance of the light transmitted between the metal fine particles is measured to detect the change in the refractive index of the medium in the vicinity of the surfaces of the metal fine particles due to adsorption or deposition of the target substance on the metal fine particles, the localized plasmon resonance sensor described in PTL 2 has problems that it is necessary to precisely control the size and arrangement of the metal fine particles and that it is difficult to sufficiently enhance the intensity of the detection signal because the detection signal is the absorbance.

Furthermore, the surface plasmon resonance is also applied to improve the efficiency of photoelectric conversion in photoelectric conversion elements, and for example, Japanese Unexamined Patent Application Publication No. 2012-38541 (PTL 3) describes a plasmon resonance type photoelectric conversion element comprising: an anode electrode in which a transparent electrode layer, a metal microparticle layer, a semiconductor thin film made of n-type semiconductor, and a pigment adsorption layer are stacked on a transparent substrate in this order, a cathode electrode opposed to the anode electrode across an electrolyte including oxidation-reduction species.

CITATION LIST

Patent Literature

[PTL 1] Japanese Unexamined Patent Application Publication No. 2011-141265
[PTL 2] Japanese Unexamined Patent Application Publication No. 2000-356587
[PTL 3] Japanese Unexamined Patent Application Publication No. 2012-38541

SUMMARY OF INVENTION

Technical Problem

However, if the photoelectric conversion element as described in PTL 3 is applied to a sensor, the present inventors have found problems that it is necessary to control the metal fine particles, making it difficult to improve the sensor sensitivity as well as that since oxidation and reduction reactions of the electrolyte are involved, the sample itself as the measurement target is oxidized and reduced, affecting the sensor accuracy.

The present invention has been made in view of the problems of the conventional art, and an object thereof is to provide an electricity measuring type surface plasmon resonance sensor which enables easy reduction in size and easy achievement of a higher throughput and has a sufficient sensor accuracy, and an electricity measuring type surface plasmon resonance sensor chip used in the same.

Solution to Problem

The present inventors have made earnest studies to achieve the above object and found as a result that, when a chip has a combination of a prism, a transparent electrode, an n-type transparent semiconductor film, and a plasmon resonance film electrode arranged in this order and when incident light entering the prism at an incident angle within a specific range reaches the plasmon resonance film electrode, the reaching light is converted into a surface plasmon polariton propagating through the plasmon resonance film electrode, which can be directly detected as an electric signal from the transparent electrode and the plasmon resonance film electrode. The present inventors have also found that the magnitude of the electric signal detected varies with high accuracy depending on the refractive index of the sample in the vicinity of the plasmon resonance film electrode. Furthermore, the present inventors have found that, since the refractive index of the sample corresponds to the concentration or state of the sample, it is possible to use the chip of the above configuration as a sensor chip capable of measuring the concentration change and state change of the sample. These findings have led to the completion of the present invention.

Specifically, an electricity measuring type surface plasmon resonance sensor of the present invention comprises:
a plasmon polariton intensifying sensor chip in which a prism and a sensor chip including a transparent electrode, an n-type transparent semiconductor film, and a plasmon resonance film electrode arranged in this order are arranged in an order of the prism, the transparent electrode, the n-type transparent semiconductor film, and the plasmon resonance film electrode; and
an electric measuring apparatus which directly measures a current or voltage from the transparent electrode and the plasmon resonance film electrode.

In addition, the electricity measuring type surface plasmon resonance sensor of the present invention comprises:
a plasmon polariton intensifying sensor chip which includes
a sensor chip provided with
a plasmon resonance film electrode which is capable of converting incident light into a surface plasmon polariton,
an n-type transparent semiconductor film which is arranged on an incident light side of the plasmon resonance film electrode, which transmits the incident light, and which is capable of receiving hot electrons emitted from the plasmon resonance film electrode when the transmitted incident light interacts with the plasmon resonance film electrode, and
a transparent electrode which is capable of picking up as an electric signal the hot electrons transferred from the n-type transparent semiconductor film and
a prism capable of controlling an angle of the incident light so as to allow the incident light to totally reflect between the plasmon resonance film electrode and the n-type transparent semiconductor film; and
an electric measuring apparatus which is capable of directly measuring a current or voltage from the transparent electrode and the plasmon resonance film electrode.

As a preferable embodiment of the above electricity measuring type surface plasmon resonance sensor, in the sensor chip, a combination of the n-type transparent semiconductor film and the plasmon resonance film electrode is preferably a combination which forms a Schottky barrier.

In addition, as a preferable embodiment of the above electricity measuring type surface plasmon resonance sensor, in the sensor chip, a thickness of the plasmon resonance film electrode is preferably 200 nm or less (not including 0).

Moreover, as a preferable embodiment of the above electricity measuring type surface plasmon resonance sensor, in the sensor chip, the n-type transparent semiconductor film is preferably a film made of at least one n-type semiconductor selected from the group consisting of $TiO_2$, ZnO, $SnO_2$, $SrTiO_3$, $Fe_2O_3$, TaON, $WO_3$, and $In_2O_3$.

In addition, as a preferable embodiment of the above electricity measuring type surface plasmon resonance sensor, it is preferable that the sensor chip further include an adhesive layer between the n-type transparent semiconductor film and the plasmon resonance film electrode and it is also preferable that the sensor chip further include a protection film on a surface of the plasmon resonance film electrode opposite to the n-type transparent semiconductor film.

An electricity measuring type surface plasmon resonance sensor chip of the present invention is a sensor chip which is used in the electricity measuring type surface plasmon resonance sensor described above and which includes the transparent electrode, the n-type transparent semiconductor film, and the plasmon resonance film electrode arranged in this order.

A method for detecting a change in a surface plasmon polariton of the present invention is a method for detecting a change in a surface plasmon polariton using an electricity measuring type surface plasmon resonance sensor which includes
a plasmon polariton intensifying sensor chip in which a prism and a sensor chip including a transparent electrode, an n-type transparent semiconductor film, and a plasmon resonance film electrode arranged in this order are arranged in an order of the prism, the transparent electrode, the n-type transparent semiconductor film, and the plasmon resonance film electrode and
an electric measuring apparatus which directly measures a current or voltage from the transparent electrode and the plasmon resonance film electrode, the method comprising:
producing a surface plasmon polariton by emitting light onto the prism and allowing the light, passing through the prism, the transparent electrode, and the n-type transparent semiconductor, to totally reflect between the plasmon resonance film electrode and the n-type transparent semiconductor film to interact with the plasmon resonance film electrode;
picking up hot electrons, produced by the surface plasmon polariton and transferred to the n-type transparent semiconductor film, from the transparent electrode as an electric signal; and
measuring a change in current or voltage between the transparent electrode and the plasmon resonance film electrode with the electric measuring apparatus.

Note that although it is not exactly clear why the object is achieved by the configuration of the present invention, the present inventors presume the reason as follows. Specifically, in an electricity measuring type surface plasmon resonance sensor chip of the present invention (hereinafter simply referred to as the "sensor chip" in some cases) and an electricity measuring type surface plasmon resonance sensor (hereinafter simply referred to as the "sensor" in some cases) using the sensor chip and a prism, light is emitted from the prism side onto the plasmon resonance film electrode, and when the light having passed through the prism totally reflects between the plasmon resonance film electrode and the n-type transparent semiconductor film, energy exudes (evanescent wave) at the backside of the total reflection surface. Thus, when the incident angle of the light to the interface is equal to or greater than the critical angle (hereinafter referred to as the "total reflection angle"), the evanescent wave produced at the site of total reflection and the plasmon resonance film in contact with the backside interact with each other to excite the surface plasmon polaritons. Here, since the incident angle of the incident light can be controlled using the prism and adjusted to the total reflection angle described above, the surface plasmon polaritons produced are sufficiently intensified.

The present inventors presume as follows. When the surface plasmon polariton then sufficiently polarizes the plasmon resonance film electrode, hot electrons are emitted and hot holes are formed. The emitted hot electrons can be smoothly transferred to the transparent electrode being the counter electrode through the plasmon resonance film electrode and the n-type transparent semiconductor film where a Schottky barrier is formed. Therefore, the sensor chip of the present invention and the sensor using the sensor chip and a prism can sufficiently detect the surface plasmon polaritons as an electric signal from the plasmon resonance film electrode and the transparent electrode.

Moreover, the present inventors presume as follows. In the sensor chip of the present invention and the sensor using the sensor chip and a prism in combination, the change in refractive index in the vicinity of the plasmon resonance film electrode varies the site of total reflection, that is, the range of incident angle for producing surface plasmon polaritons (incident angle of light entering the prism) as well as the intensity of the surface plasmon polaritons produced. Additionally, since the surface plasmon polaritons intensify the electric field produced in the plasmon resonance film electrode due to the entrance of light, the amount of current which varies in response to the change in electric field varies depending on the intensity of surface plasmon polaritons. Thus, it is possible to measure with sufficient accuracy the change in refractive index of the sample in the vicinity of the plasmon resonance film electrode. Therefore, the present inventors presume that the sensor chip of the present invention and the sensor using the sensor chip and a prism make it possible to highly accurately monitor the concentration change and state change of the sample, and since the detection signal is an electric signal, it is possible to easily enhance the intensity electrically or to easily measure the intensity as a current.

Advantageous Effects of Invention

The present invention makes it possible to provide an electricity measuring type surface plasmon resonance sensor which is easy to reduce in size and achieve a higher throughput and has a sufficient sensor accuracy, and an electricity measuring type surface plasmon resonance sensor chip used in the same.

DESCRIPTION OF EMBODIMENTS

Figure 1A:
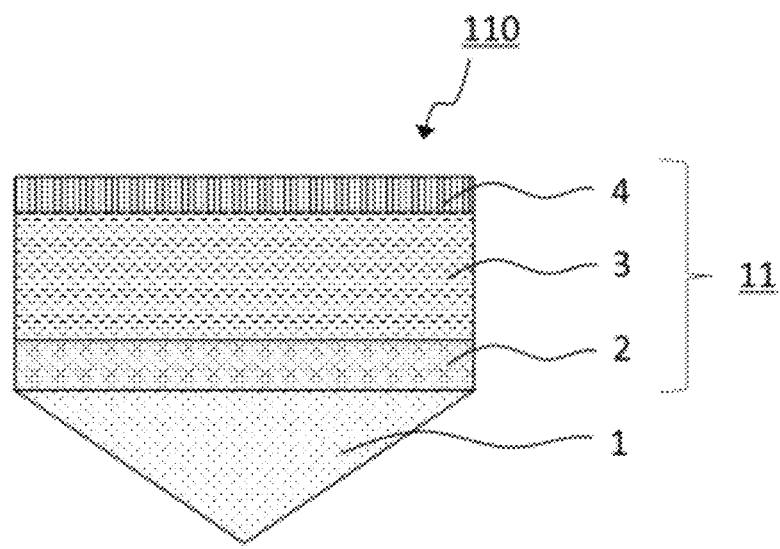
FIG. 1A is a schematic longitudinal cross-sectional view illustrating Preferable Embodiment 1 of a plasmon polariton intensifying sensor chip.

Hereinafter, the present invention is described in detail with reference to its preferred embodiments. An electricity measuring type surface plasmon resonance sensor of the present invention comprises:

a plasmon polariton intensifying sensor chip in which a prism and a sensor chip including a transparent electrode, an n-type transparent semiconductor film, and a plasmon resonance film electrode arranged in this order are arranged in an order of the prism, the transparent electrode, the n-type transparent semiconductor film, and the plasmon resonance film electrode; and an electric measuring apparatus which directly measures a current or voltage from the transparent electrode and the plasmon resonance film electrode. In addition, the electricity measuring type surface plasmon resonance sensor of the present invention also comprises:

a plasmon polariton intensifying sensor chip which includes
  a sensor chip provided with
    a plasmon resonance film electrode which is capable of converting incident light into a surface plasmon polariton,
    an n-type transparent semiconductor film which is arranged on an incident light side of the plasmon resonance film electrode, which transmits the incident light, and which is capable of receiving hot electrons emitted from the plasmon resonance film electrode when the transmitted incident light interacts with the plasmon resonance film electrode, and
    a transparent electrode which is capable of picking up as an electric signal the hot electrons transferred from the n-type transparent semiconductor film and
  a prism capable of allowing the incident light to totally reflect between the plasmon resonance film electrode and the n-type transparent semiconductor film; and
an electric measuring apparatus which is capable of directly measuring a current or voltage from the transparent electrode and the plasmon resonance film electrode. Moreover, the electricity measuring type surface plasmon resonance sensor chip of the present invention is a sensor chip used in the above electricity measuring type surface plasmon resonance sensor of the present invention and has a transparent electrode, an n-type transparent semiconductor film, and a plasmon resonance film electrode arranged in this order.

Hereinafter, specific description is provided taking examples of preferable embodiments of the electricity measuring type surface plasmon resonance sensor (hereinafter, the "sensor"), the plasmon polariton intensifying sensor chip (hereinafter, the "intensifying sensor chip"), and the electricity measuring type surface plasmon resonance sensor chip (hereinafter, the "sensor chip") with reference to the drawings, but the present invention is not limited to these. Note that in the following description and drawings, the same or corresponding elements are denoted by the same reference numerals, and redundant description is omitted.

FIG. 1A illustrates a first preferable embodiment of the intensifying sensor chip (Preferable Embodiment 1; intensifying sensor chip 110). As illustrated in FIG. 1A, the intensifying sensor chip 110 of Preferable Embodiment 1 is a stack of a prism (hereinafter, the prism 1) having on its top a sensor chip (photoelectric conversion unit; sensor chip 11 in Preferable Embodiment 1) composed of a transparent electrode (hereinafter, the transparent electrode 2), an n-type transparent semiconductor film (hereinafter, the n-type transparent semiconductor film 3), and a plasmon resonance film electrode (hereinafter, the plasmon resonance film electrode 4) in the order of the prism 1, the transparent electrode 2, the n-type transparent semiconductor film 3, and the plasmon resonance film electrode 4.

Figure 1B:
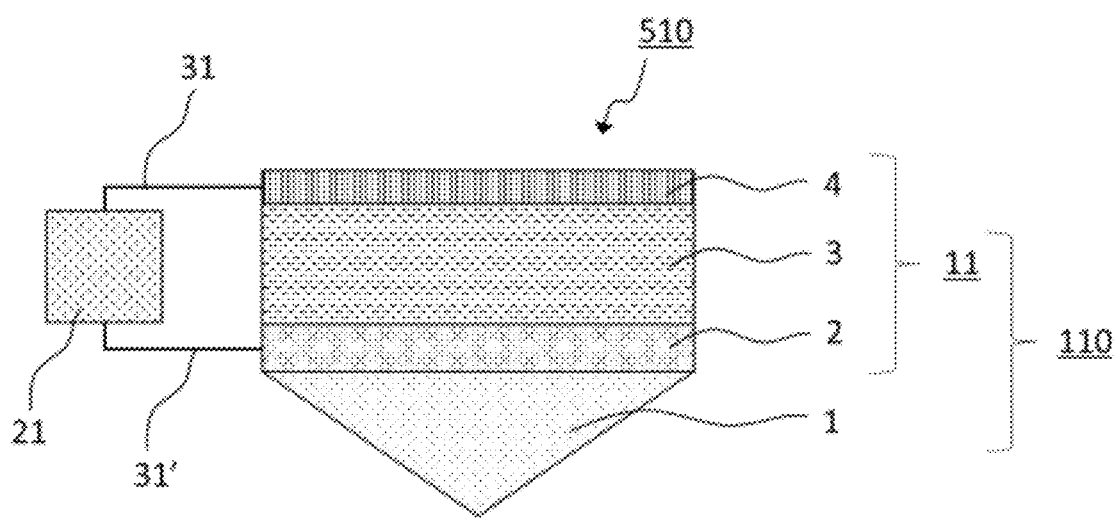
FIG. 1B is a schematic longitudinal cross-sectional view illustrating Preferable Embodiment 1 of an electricity measuring type surface plasmon resonance sensor.

In addition, FIG. 1B illustrates a first preferable embodiment of a sensor (Preferable Embodiment 1; sensor 510). As illustrated in FIG. 1B, the sensor 510 of Preferable Embodiment 1 includes an intensifying sensor chip 110 which is provided with the prism 1 and the sensor chip 11 and an electric measuring apparatus (electric measuring apparatus 21) which is electrically connected via external circuits (external circuits 31 and 31') to the transparent electrode 2 and the plasmon resonance film electrode 4 of the sensor chip 11.

(Prism)

The prism 1 has a function of allowing incident light to totally reflect between the n-type transparent semiconductor film 3 and the plasmon resonance film electrode 4. Specifically, in the embodiment of the present disclosure, the prism 1 controls the angle of the incident light so as to satisfy the conditions for total reflection between the n-type transparent semiconductor film 3 and the plasmon resonance film electrode 4. Then, the incident light whose angle has been controlled by the prism 1 is totally reflected between the n-type transparent semiconductor film 3 and the plasmon resonance film electrode 4, that is, at the interface between the plasmon resonance film electrode 4 and the n-type transparent semiconductor film 3. Note that, when the adhesive layer to be described later is further provided, the incident light whose angle has been controlled by the prism 1 is totally reflected at the interface between the plasmon resonance film electrode 4 and the adhesive layer or at the interface between the adhesive layer and the n-type transparent semiconductor film 3. Moreover, when there are two or more adhesive layers to be described later, the incident light whose angle has been controlled by the prism 1 is totally reflected at the interface between the plasmon resonance film electrode 4 and the adhesive layer, the interface between the adhesive layer and the n-type semiconductor film 3, or the interface between the two adjacent adhesive layers. Examples of the prism 1 include triangle prisms in the shape of a triangular prism (such as right-angled prisms (isosceles right triangles with 45° corners and right triangles with 60° and 30° corners) and equilateral triangle prisms); trapezoidal prisms in the shape of a trapezoid column; cylindrical prisms in which a face of the cylinder is a planar shape (the length of the side (short side) between the planar surface (rectangle) and the upper face and the bottom face of the cylinder may be less than the diameter of the circle of the upper face and the bottom face); spherical prisms in which one of the faces of the sphere is a planar shape (the diameter of the face (circle) may be less than the diameter of the sphere); and pentaprisms in the shape of a pentagon prism. Among these, the prism 1 is preferably the triangular prism as illustrated in FIG. 1A as well as the trapezoidal prism, the cylindrical prism, or the spherical prism and more preferably the right-angled prism; a semi-cylindrical prism whose short side has a length equal to the diameter of the circle of the upper face and the bottom face; or a semi-spherical prism in which the diameter of the circle as the planar surface is equal to the diameter of the sphere from the viewpoint that the incident light entering the prism tends to more efficiently reach the plasmon resonance film electrode 4.

As to the sensor, one sensor chip (photoelectric conversion unit) may be provided with one prism 1 or two or more prisms 1 in the form of an array, and two or more photoelectric conversion units may be provided with one prism 1.

The size of the prism 1 is not particularly limited, and the length of the longest side in the case where the surface in contact with the sensor chip is polygonal, or the length of the diameter of the circumscribed circle of the surface in contact with the sensor chip in other cases is preferably 10 nm to 10 cm, more preferably 50 nm to 5 cm, and further preferably 100 nm to 3 cm. Note that it is possible to mold prisms of nanometer size to micrometer size using patterning techniques such as laser ablation, electron beam lithography, nanoimprint lithography, and optical interference lithography, and prisms of micrometer size or larger can be obtained by optical polishing after cutting. When the size of the prism 1 is less than the lower limit, the manufacturing difficulty increases and the performance as a prism decreases, and as a result the performance as a sensor tends to decrease. On the other hand, when the size of the prism 1 exceeds the upper limit, downsizing as a sensor tends to be difficult.

When the prism 1 is a triangular prism, the transparent electrode 2, the n-type transparent semiconductor film 3, and the plasmon resonance film electrode 4 are preferably arranged on one of the faces of the triangular prism as illustrated in FIG. 1A, and light preferably enters a face other than the inclined face. In addition, when the prism 1 is a trapezoidal prism, the transparent electrode 2, then-type transparent semiconductor film 3, and the plasmon resonance film electrode 4 are preferably arranged on one of the faces of the trapezoidal prism including the lower bottom edges (lower bottom face) of the trapezoid, and light preferably enters a face serving as a hypotenuse of the trapezoid.

In each of the triangular prism and the trapezoidal prism, the angle formed by the face of the prism entered by the incident light and the face in contact with the sensor chip (sensor chip 11 in Preferable Embodiment 1) is preferably 5 to 85°, more preferably 15 to 75°, and further preferably 25 to 65°.

Moreover, when the prism 1 is a cylindrical prism or a spherical prism, the planar surface thereof preferably has the transparent electrode 2, the transparent semiconductor film 3, and the plasmon resonance film electrode 4 arranged thereon, and light preferably enters the curved face.

As to the cylindrical prism, let the diameter of the cylinder be 1 and the planar surface be the bottom face. Consider a line extending from the center of the bottom face in the vertical direction and intersecting with an arc. The ratio of the distance between the center of the bottom face being the intersection (hereinafter referred to as the "prism height") to the diameter of the cylinder (prism height/diameter of the cylinder) is preferably less than 1 (exclusive of 0), more preferably 0.2 or more and less than 0.8, and further preferably 0.4 or more and less than 0.6.

As to the spherical prism, let the diameter of the sphere be 1 and the planar surface be the bottom face. The ratio of the height from the center of the bottom face (hereinafter referred to as the "prism height") to the diameter of the sphere (prism height/diameter of the sphere) is preferably less than 1 (exclusive of 0), more preferably 0.2 or more and less than 0.8, and further preferably 0.4 or more and less than 0.6.

When the angle or the prism height of the triangular prism, the cylindrical prism, and the spherical prism is less than the lower limit or exceeds the upper limit, it tends to be difficult to allow entrance of light at an incident light angle which can excite surface plasmon polaritons or the sensitivity and accuracy of the sensor tend to decrease due to multiple reflection of light inside the prism.

In addition, when the prism 1 is a pentaprism, the transparent electrode 2, the transparent semiconductor film 3, and the plasmon resonance film electrode 4 are preferably arranged on any of the lateral faces of the pentagonal prism, and light preferably enters any of the remaining four lateral faces.

The material of the prism 1 is not particularly limited, and examples thereof include glass, macromolecule polymers (such as poly(methyl methacrylate), polystyrene, polyethylene, epoxy, and polyester), sulfur, ruby, sapphire, diamond, zinc selenide (ZnSe), zinc sulfide (ZnS), germanium (Ge), silicon (Si), cesium iodide (CsI), potassium bromide (KBr), thallium bromoiodide, calcium carbonate ($CaCO_3$), barium fluoride ($BaF_2$), magnesium fluoride ($MgF_2$), and lithium fluoride (LiF). In addition, the material of the prism 1 may be a liquid, and examples thereof include water, oil, glycerol, diiodomethane, α-bromonaphthalene, toluene, isooctane, cyclohexane, 2,4-dichlorotoluene, ethylbenzene, dibenzyl ether, aniline, styrene, organic compound solutions (such as sucrose solution), and inorganic compound solutions (such as potassium chloride solution and sulfur-containing solution). These may be used singly or two or more kinds thereof may be used in combination.

Note that a light source of incident light may be arranged inside the prism 1 regardless of the shape and material of the prism 1.

(Transparent Electrode)

The transparent electrode 2 has a function of picking up as an electric signal the hot electrons (electrons) which have been emitted along with the surface plasmon polaritons produced in the plasmon resonance film electrode 4 and which have transferred through the n-type transparent semiconductor film 3, functions as a counter electrode of the plasmon resonance film electrode 4, and is electrically connected to the plasmon resonance film electrode 4 via an electric measuring apparatus (electric measuring apparatus 21 in Preferable Embodiment 1) and external circuits (such as conductive wire and an ammeter; external circuits 31 and 31' in Preferable Embodiment 1) if necessary. In addition, the transparent electrode 2 needs to be able to transmit light. Note that in the present invention, a film, an electrode, a layer, a substrate, or the like is "able to transmit light" means that the light transmittance is 40% or more when light having a wavelength at least in the range of 400 to 1500 nm vertically enters one surface of the film, the electrode, the layer, the substrate, or the like. The light transmittance is preferably 50% or more and further preferably 60% or more.

It is possible to appropriately select the material of the transparent electrode 2 from those conventionally used as a transparent electrode in the field of semiconductors, and examples thereof include copper (Cu), gold (Au), silver (Ag), platinum (Pt), zinc (Zn), chromium (Cr), aluminum (Al), titanium (Ti), titanium nitride (TiN), ITO (Indium tin oxide), FTO (Fluorine-doped tin oxide), transparent conductive materials including a metal oxide such as ZnO doped with other elements (aluminum, gallium, and the like), and shapes of thin film or net composed of laminates thereof. In addition, examples of the material of the transparent electrode 2 also include n-type semiconductors constituting the following n-type transparent semiconductor film, and in the sensor chip, the transparent electrode 2 and the n-type transparent semiconductor film 3 may be layers of the same material.

The thickness of the transparent electrode 2 is usually 1 to 1000 nm. Note that the thicknesses of the film, the electrode, the layer, the substrate, or the like can be measured by observation with a scanning electron microscope (SEM) or a transmission electron microscope (TEM).

(n-Type Transparent Semiconductor Film)

The n-type transparent semiconductor film 3 has a function of receiving hot electrons emitted when the plasmon resonance film electrode 4 is sufficiently polarized by the surface plasmon polaritons excited in the plasmon resonance film electrode 4, and is composed of n-type semiconductor. In addition, the n-type transparent semiconductor film 3 needs to be able to transmit light.

Examples of the n-type semiconductor include inorganic oxide semiconductors, and these may be used singly or two or more kinds thereof may be used as a composite material. Examples of the inorganic oxide semiconductors include titanium dioxide ($TiO_2$), zinc oxide (ZnO), tin dioxide ($SnO_2$), gallium nitride (GaN), gallium oxide (GaO), strontium titanate ($SrTiO_3$), iron oxide ($Fe_2O_3$), tantalum oxynitride (TaON), tungsten oxide ($WO_3$), indium oxide ($In_2O_3$), and composite oxides thereof. Among these, the n-type semiconductor is preferably at least one semiconductor selected from the group consisting of $TiO_2$, ZnO, $SnO_2$, $SrTiO_3$, $Fe_2O_3$, TaON, $WO_3$, and $In_2O_3$ and more preferably at least one semiconductor selected from the group consisting of $TiO_2$, ZnO, $SnO_2$, $SrTiO_3$, $Fe_2O_3$, and $In_2O_3$ from the viewpoint of high transparency and high conductivity.

The thickness of the n-type transparent semiconductor film 3 is preferably 1 to 1000 nm, more preferably 5 to 500 nm, and further preferably 10 to 300 nm. When the thickness is less than the lower limit, the n-type transparent semiconductor cannot exist as a film and tends to fail to achieve a sufficient function as a semiconductor. On the other hand, when the thickness exceeds the upper limit, the light transmittance tends to decrease and the resistance tends to increase, making it difficult for the current to flow.

(Plasmon Resonance Film Electrode)

The plasmon resonance film electrode 4 has a function of converting entering light (incident light) into surface plasmon polaritons and is a film made of a plasmonic material capable of producing surface plasmon polaritons by the interaction with light. Also, the plasmon resonance film electrode 4 has a function of picking up the surface plasmon polaritons as an electric signal, functions as a counter electrode of the transparent electrode 2, and is electrically connected to the transparent electrode 2 via an electric measuring apparatus (electric measuring apparatus 21 in Preferable Embodiment 1) and external circuits (such as conductive wire and an ammeter; external circuits 31 and 31' in Preferable Embodiment 1) if necessary.

Examples of the plasmonic material include metals, metal nitrides, and metal oxides, and these may be used singly or two or more kinds thereof may be used as a composite material. Among these, as the plasmonic material, preferable examples of the metals can include gold (Au), silver (Ag), aluminum (Al), copper (Cu), platinum (Pt), palladium (Pd), zinc (Zn), and sodium (Na), preferable examples of the metal nitrides can include titanium nitride (TiN), and preferable examples of the metal oxides can include ITO (Indium tin oxide), FTO (Fluorine-doped tin oxide), and ZnO doped with other elements (aluminum, gallium, and the like). Among these, the plasmonic material is preferably at least one selected from the group consisting of Au, Ag, Al, Cu, Pt, Pd, and TiN and is more preferably at least one selected from the group consisting of Au, Ag, Al, Cu, and Pt.

The thickness of the plasmon resonance film electrode 4 is preferably 200 nm or less (not including 0), more preferably 1 to 150 nm, further preferably 5 to 100 nm, and still more preferably 10 to 60 nm. When the thickness is less than the lower limit, the plasmon resonance film electrode tends to fail to exist as a film. On the other hand, when the thickness exceeds the upper limit, there is a tendency that the evanescent wave reaching the surface opposite to the surface entered by light weakens, which makes it impossible to excite sufficient surface plasmon polaritons. In addition, the thickness of the plasmon resonance film electrode 4 is particularly preferably 10 to 34 nm from the viewpoint of making it possible to measure refractive indices in a wider range (preferably 1.33 to 1.40) as the refractive index of the sample as the measurement target, and is particularly preferably 35 to 60 nm from the viewpoint of increasing the rate of change in the current value relative to the change in the refractive index.

Figure 2:
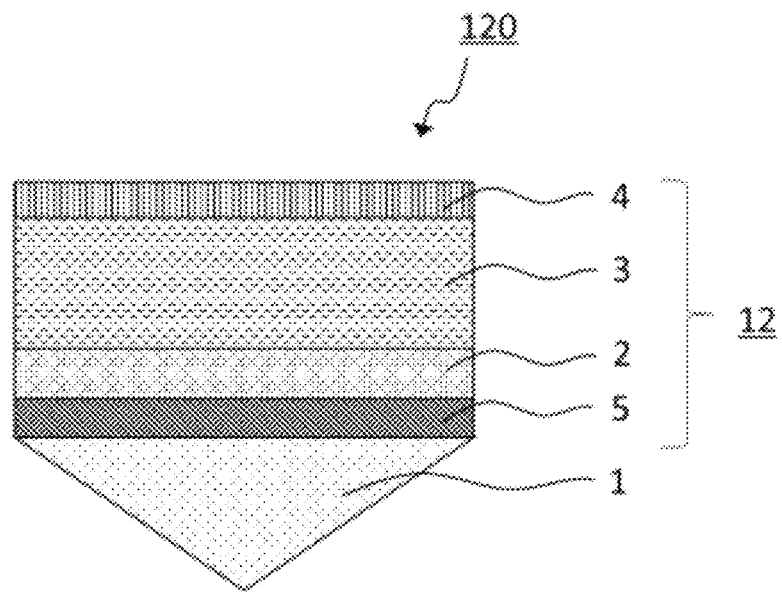
FIG. 2 is a schematic longitudinal cross-sectional view illustrating Preferable Embodiment 2 of the plasmon polariton intensifying sensor chip.

FIG. 2 illustrates a second preferable embodiment (Preferable Embodiment 2) of the intensifying sensor chip. The sensor chip constituting the intensifying sensor chip may further include another layer as long as the effects of the present invention are not impaired. For example, as in the case of the sensor chip (photoelectric conversion unit) 12 illustrated in FIG. 2, the sensor chip may further include a transparent substrate 5 between the prism 1 and the transparent electrode 2 mainly in order to support the sensor chip 12 (intensifying sensor chip 120). The material of the transparent substrate 5 is not particularly limited as long as it is able to transmit light, and examples thereof include glass; and polymer organic compounds such as plastics and films. The transparent substrate 5 may be a single layer containing one of these or a multilayer formed by stacking two or more of such single layers. In the case of further including the transparent substrate 5, its thickness is usually 0.01 to 2 mm.

Additionally, in the case of further including the transparent substrate 5, an intermediate layer (not illustrated) may be further provided mainly in order to closely adhere to the transparent substrate 5. The material of the intermediate layer is not particularly limited as long as it is able to transmit light, and examples thereof include glycerol, water, macromolecule polymers (such as poly(methylmethacrylate), polystyrene, polyethylene, epoxy, and polyester), oil, diiodomethane, α-bromonaphthalene, toluene, isooctane, cyclohexane, 2,4-dichlorotoluene, organic compound solutions (such as sucrose solution), inorganic compound solutions (such as potassium chloride solution and sulfur-containing solution), ethylbenzene, dibenzyl ether, aniline, and styrene. These may be used singly or two or more kinds thereof may be used in combination.

Figure 3:
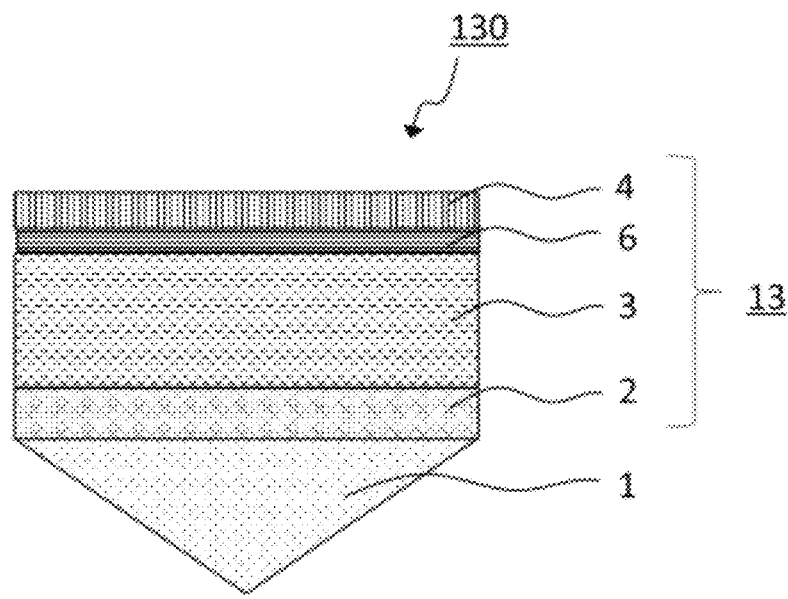
FIG. 3 is a schematic longitudinal cross-sectional view illustrating Preferable Embodiment 3 of the plasmon polariton intensifying sensor chip.

FIG. 3 illustrates a third preferable embodiment (Preferable Embodiment 3) of the intensifying sensor chip. As in the case of the sensor chip (photoelectric conversion unit) 13 illustrated in FIG. 3, the sensor chip constituting the intensifying sensor chip may further include an adhesive layer 6 between the n-type transparent semiconductor film 3 and the plasmon resonance film electrode 4 mainly in order to more firmly fix the plasmon resonance film electrode 4 (intensifying sensor chip 130). Examples of the material of the adhesive layer 6 include titanium (Ti), chromium (Cr), nickel (Ni), and titanium nitride (TiN), and the adhesive layer may be a single layer containing one of these or a multilayer formed by stacking two or more of such single layers. In addition, the adhesive layer 6 does not have to cover the entire boundary interface between the n-type semiconductor film 3 and the plasmon resonance film electrode 4. Note that there is a tendency that the evanescent wave reaching the surface opposite to the surface entered by light weakens, which makes it impossible to excite surface plasmon polaritons of sufficient strength. For this reason, in the sensor chip, the n-type transparent semiconductor film 3 and the plasmon resonance film electrode 4 are preferably arranged in the vicinity of each other, and the distance between the n-type transparent semiconductor film 3 and the plasmon resonance film electrode 4 is preferably 25 nm or less and more preferably 1 to 10 nm. Therefore, in the case of further including the adhesive layer 6, its thickness is preferably 25 nm or less and more preferably 1 to 10 nm.

Figure 4:
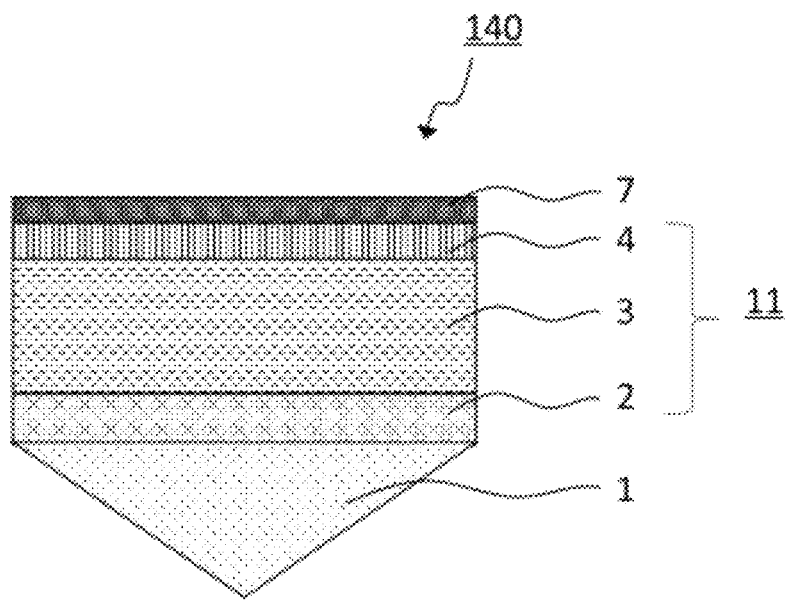
FIG. 4 is a schematic longitudinal cross-sectional view illustrating Preferable Embodiment 4 of the plasmon polariton intensifying sensor chip.

FIG. 4 illustrates a fourth preferable embodiment (Preferable Embodiment 4) of the intensifying sensor chip. As illustrated in FIG. 4, the intensifying sensor chip may further include a protection film 7 on the exposed surface of the plasmon resonance film electrode 4 mainly in order to protect the exposed surface (intensifying sensor chip 140). Examples of the material of the protection film 7 include glass, plastics, titanium oxide ($TiO_2$), magnesium fluoride ($MgF_2$), tantalum pentoxide ($Ta_2O_5$), aluminum oxide ($Al_2O_3$), diamond like carbon, and silicon carbide, and the protection film 7 may be a single layer containing one of these or a multilayer formed by stacking two or more of such single layers. Note that the reach of the surface plasmon polaritons produced in the plasmon resonance film electrode 4 is within about 300 nm from the surface of the plasmon resonance film electrode. For this reason, in the case of further including the protection film 7, its thickness is preferably 300 nm or less, more preferably 200 nm or less, and further preferably 100 nm or less.

Figure 5:
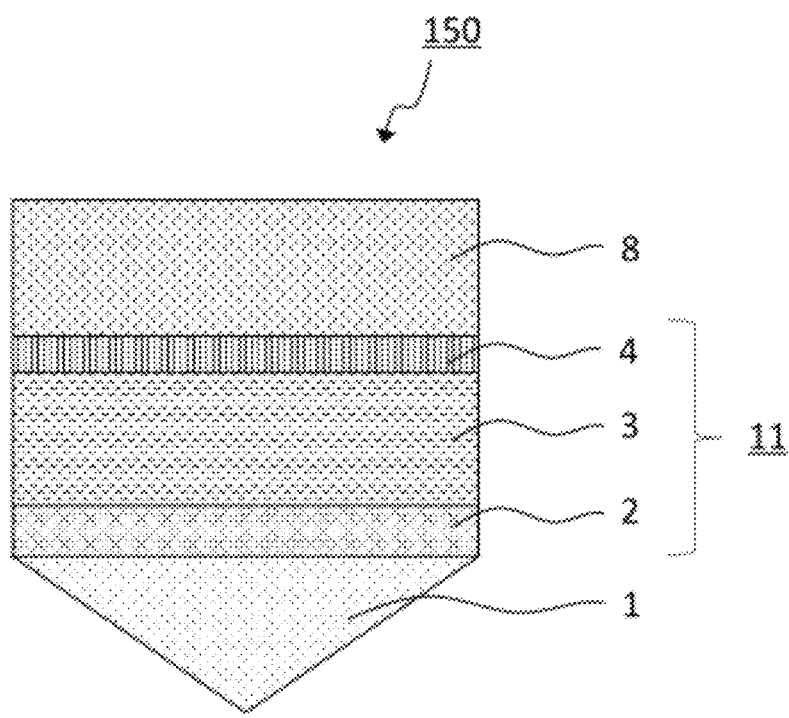
FIG. 5 is a schematic longitudinal cross-sectional view illustrating Preferable Embodiment 5 of the plasmon polariton intensifying sensor chip.

FIG. 5 illustrates a fifth preferable embodiment (Preferable Embodiment 5) of the intensifying sensor chip. As illustrated in FIG. 5, the intensifying sensor chip may further include a sample chamber 8 on the surface of the plasmon resonance film electrode 4 opposite to the n-type transparent semiconductor film 3 or on the above-described protection film 7 (not illustrated in FIG. 5) mainly in order to hold the sample as the measurement target (intensifying sensor chip 150). Note that the sample chamber 8 may be arranged so as to supply the sample at any flow rate or may be arranged in the shape of a cell so as to contain the sample in a certain volume.

Additionally, the intensifying sensor chip and the sensor chip are not limited to Embodiments 1 to 5 (the intensifying sensor chips 110 to 150 and the sensor chips 11 to 13) of the intensifying sensor chips described above, and may be any combination thereof (not illustrated) such as those including both of the transparent substrate 5 and the sample chamber 8. Moreover, the intensifying sensor chip may be used singly or two or more thereof may be arranged in the shape of a line or a planar surface.

In the sensor chip constituting the intensifying sensor chip, the combination of the n-type transparent semiconductor film 3 with the plasmon resonance film electrode 4 (with the adhesive layer 6 in the case of further including the adhesive layer 6) is preferably a combination which forms a Schottky barrier. Consider such a setup that the transparent electrode 2 of the sensor chip is connected to the working electrode of a voltage applying means such as a semiconductor analyzer, and the plasmon resonance film electrode 4 is connected to the counter electrode and the reference electrode of the voltage applying means. It is possible to observe that the sensor chip forms a Schottky barrier by measuring a current value when a voltage in a range of −1.5 to +1.5 V is applied to the working electrode. Regarding the current value, the maximum value of the absolute value of the current value at 0 V or more and +1.5 V or less is preferably one fifth or less, more preferably one tenth, and further preferably one twentieth of the maximum value of the absolute value of the current value at −1.5 V or more and less than 0 V. The rectifying characteristics are attenuated when this ratio exceeds the upper limit value, and therefore the noise at the time of measurement tends to increase and the sensitivity and accuracy of the sensor tend to decrease.

Such a combination which forms a Schottky barrier is a combination which satisfies the condition represented by the formula: $\varphi S < \varphi M$, where the work function of the n-type transparent semiconductor film 3 is denoted by $\varphi S$, and the work function of the plasmon resonance film electrode 4 (or the adhesive layer 6) is denoted by $\varphi M$.

The values of the work function for various materials are known, and for example, as the work function of the n-type transparent semiconductor film 3 ($\varphi S$), (I) Akihito Imanishi et al., J. Phys. Chem. C, 2007, 111(5), p. 2128-2132; (II) Min Wei et al., Energy Procedia, 2012, Volume 16, Part A, p. 76-80; (III) David Ginley et al., "Handbook of Transparent Conductors," 2011; (IV) L. F. Zagonel et al., J. Phys.: Condens. Matter, 2009, 21, 31; (V) E. R. Batista et al., J. Phys. Chem. B, 2002, 106(33), p. 8136-8141; (VI) Gy. Vida et al., 2003, Microsc. Microanal., 9(4), p. 337-342; and (VII) W. J. Chu et al., J. Phys. Chem. B, 2003, 107(8), p. 1798-1803 respectively state that titanium dioxide ($TiO_2$): 4.0 to 4.2 (I), zinc oxide (ZnO): 4.71 to 5.08 (II), tin dioxide ($SnO_2$): 5.1 (III), strontium titanate ($SrTiO_3$): 4.2 (IV), iron(III) oxide ($Fe_2O_3$): 5.6 (V), tungsten oxide ($WO_3$): 5.7 (VI), tantalum oxynitride (TaON): 4.4 (VII), and indium oxide ($In_2O_3$): 4.3 to 5.4 (III). In addition, for example, as the work function of the plasmon resonance film electrode (or the adhesive layer 6) ($\varphi M$), (VIII) 11-489 of "Handbook of Chemistry: Pure Chemistry, 4th Edition" edited by the Chemical Society of Japan states that gold (Au): 5.1 to 5.47, silver (Ag): 4.26 to 4.74, aluminum (Al): 4.06 to 4.41, copper (Cu): 4.48 to 4.94, platinum (Pt): 5.64 to 5.93, and palladium (Pd): 5.55. Additionally, (IX) Takashi Matsukawa et al., Jpn. J. Appl. Phys., 2014, 53, 04EC11 states that titanium nitride (TiN): 4.4 to 4.6.

Therefore, it is possible to select and appropriately employ a combination satisfying the above conditions from those work functions ($\varphi S$ and $\varphi M$) as the combination of the n-type transparent semiconductor film 3 with the plasmon resonance film electrode 4 (or with the adhesive layer 6) which forms a Schottky barrier. Among these, the combination of the n-type transparent semiconductor film 3 with the plasmon resonance film electrode 4 (or with the adhesive layer 6) is preferably a combination of $TiO_2$ with any one of Au, Ag, Al, Cu, Pt, Pd, and TiN, a combination of ZnO with any one of Au, Pt, and Pd, a combination of $SnO_2$ with any one of Au, Pt, and Pd, a combination of $SrTiO_3$ with any one of Au, Ag, Al, Cu, Pt, Pd, and TiN, a combination of $Fe_2O_3$ with Pt, a combination of $WO_3$ with Pd, a combination of TaON with any one of Au, Ag, Cu, Pt, Pd, and TiN, and a combination of $In_2O_3$ with any one of Pt and Pd, and more preferably a combination of $TiO_2$ with any one of Au, Ag, Cu, Pt, and Pd, a combination of ZnO with Pt, a combination of $SnO_2$ with Pt, a combination of $SrTiO_3$ with Au, Ag, Cu, Pt, and Pd, a combination of TaON with any one of Au, Cu, Pt, and Pd, and a combination of $In_2O_3$ with Pt.

(Electric Measuring Apparatus (Electric Measuring Apparatus))

The sensor of the present disclosure includes the intensifying sensor chip (for example, the intensifying sensor chip 110 in Preferable Embodiment 1) provided with the prism 1 and the sensor chip (for example, the sensor chip 11 in Preferable Embodiment 1) and the electric measuring apparatus (for example, the electric measuring apparatus 21 in Preferable Embodiment 1) which directly measures the current or voltage from the transparent electrode 2 and the plasmon resonance film electrode 4 of the sensor chip. The transparent electrode 2 and the plasmon resonance film electrode 4 are electrically connected to the electric measuring apparatus via external circuits (for example, external circuits 31 and 31' in Preferable Embodiment 1). The material of the external circuits is not particularly limited, and it is possible to use a known one as the material of conductive wire. Examples thereof include metals such as platinum, gold, palladium, iron, copper, and aluminum. Also, the electric measuring apparatus is not particularly limited as long as it can measure the voltage value or the current value, and examples thereof include semiconductor device analyzers, current measuring devices, and voltage measuring devices.

In the sensor of the present disclosure, light is emitted onto the prism 1, and the light (incident light) having passed through the prism 1, the transparent electrode 2, and the n-type transparent semiconductor 3 totally reflects between the plasmon resonance film electrode 4 and the n-type transparent semiconductor film 3, interacting with the plasmon resonance film electrode to produce surface plasmon polaritons. More specifically, the light having passed through the n-type transparent semiconductor 3 totally reflects at the interface between the n-type transparent semiconductor 3 and the plasmon resonance film electrode 4 or, if provided with an adhesive layer, the interface between plasmon resonance film electrode 4 and the adhesive layer or the interface between the adhesive layer and the n-type transparent semiconductor 3, or, if provided with two or more adhesive layers, the interface between the plasmon resonance film electrode 4 and the adhesive layer, the interface between the adhesive layer and the n-type transparent semiconductor 3, or the interface between the two adjacent adhesive layers. Evanescent waves produced by the total reflection interact with the plasmon resonance film electrode 4 to produce surface plasmon polaritons. The surface plasmon polaritons produced sufficiently polarize the plasmon resonance film electrode 4 to produce hot electrons, and the hot electrons transfer to the n-type transparent semiconductor film 3 and are picked up as an electric signal from the transparent electrode 2. Here, the transparent electrode 2 is electrically connected to the plasmon resonance film electrode 4 via the external circuits, and the electric measuring apparatus can measure the current change between the transparent electrode 2 and the plasmon resonance film electrode 4 to detect the change in surface plasmon polaritons. The hot electrons observed as an electrical signal as described above are considered to be hot electrons produced in the vicinity of the interface inside the plasmon resonance film electrode 4, and the hot electrons observable as an electric signal in this way are presumed to be hot electrons produced in the region inside the plasmon resonance film electrode 4 at a distance of about 20% of the thickness of the plasmon resonance film electrode 4 from the n-type transparent semiconductor film 3. In addition, when a sample as the measurement target is placed in the vicinity of the plasmon resonance film electrode 4 (preferably within 300 nm from the surface of the plasmon resonance film electrode 4), it is possible to detect as an electric signal the change in surface plasmon polaritons due to the change in refractive index of the sample (concentration change and state change). Thus, measurement of the electric signal makes it possible to monitor the state change of the sample.

When the wavelength of the light entering the prism 1 is increased, the range of the incident angle of the incident light for producing surface plasmon polaritons becomes smaller, whereas the strength of the surface plasmon polaritons produced is intensified. Thus, although not particularly limited depending on the purpose, the light allowed to enter the prism 1 is, for example, light in the wavelength region of visible light or light in the wavelength region of near infrared light, and has a wavelength of preferably 400 to 1500 nm, a wavelength of more preferably 500 to 1000 nm, and a wavelength of further preferably 600 to 900 nm.

Additionally, when the intensity of the light entering the prism 1 becomes strong, the amount of current produced by the surface plasmon polaritons increases. Thus, although not particularly limited depending on the purpose, the intensity of the light allowed to enter the prism 1 is preferably 0.01 to 500 mW, more preferably 0.1 to 50 mW, and further preferably 0.1 to 5 mW. When the intensity of light is less than the lower limit, the amount of current produced by the surface plasmon polaritons tends to be too small, making it impossible to obtain a sufficient sensor accuracy. On the other hand, when the intensity of light exceeds the upper limit, there is a tendency that heat is produced in the plasmon resonance film electrode 4, which may decrease the measurement sensitivity.

Figure 6:
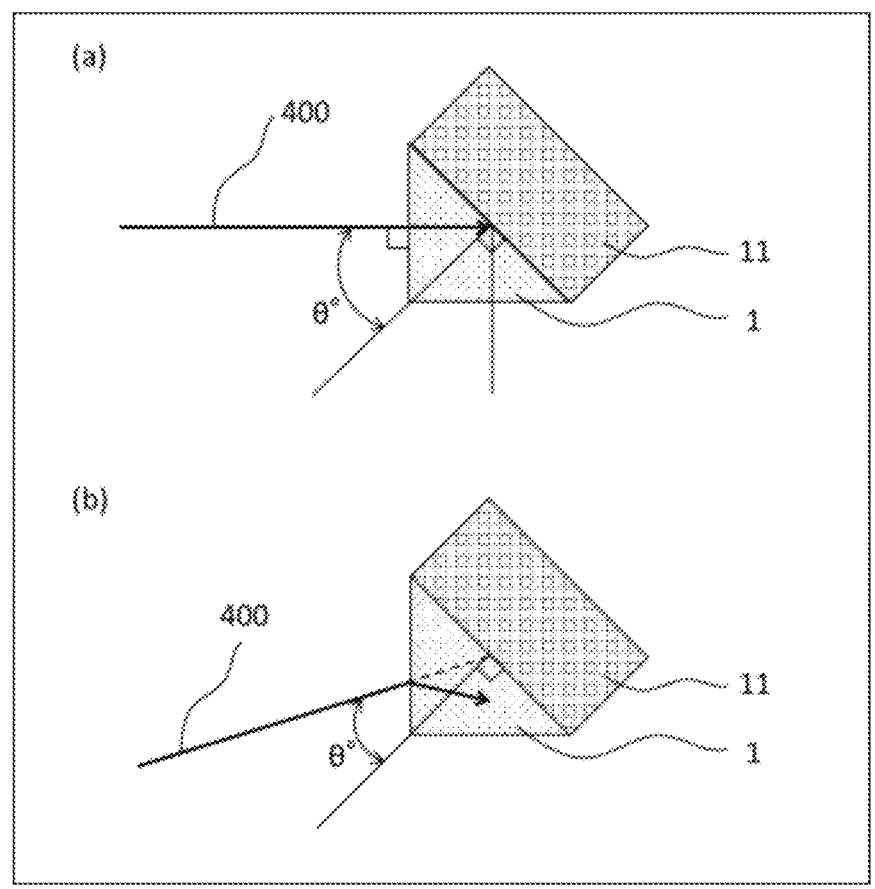
FIG. 6 is a schematic diagram illustrating an incident angle (θ°) of light entering a prism.

In the sensor of the present disclosure, it is possible to further sufficiently improve the sensor accuracy by changing the incident angle of the light entering the prism 1 depending on the sample to be measured. Note that, for example, the light entering the prism 1 travels in a straight line (incident light 400) when perpendicularly entering the surface of the prism 1 as illustrated in FIG. 6($a$), but is refracted (incident light 400) by the prism 1 when entering the surface at an angle other than the right angle as illustrated in FIG. 6($b$). Thus, in the present example, the incident angle ($\theta°$) of the light entering the prism is defined as the incident angle to the surface of the photoelectric conversion unit (sensor chip 11 in FIG. 6) in contact with the prism 1 in the absence of the prism 1, as illustrated in FIGS. 6($a$) and 6($b$). The same applies to the case where the light source of the incident light is inside the prism.

As to the sample containing the target substance and medium held on the surface of the plasmon resonance film electrode 4 opposite to the n-type transparent semiconductor film 3, on the protection film 7, or preferably inside the sample chamber 8, the sensor can detect as an electric signal the change in surface plasmon polaritons due to the concentration change and state change of the target substance. In this case, the target substance is not particularly limited, and examples thereof include small molecule compounds such as antibodies, nucleic acids (DNA, RNA, and the like), proteins, bacteria, and drugs; ions; and small molecule compounds in gaseous state and volatile substances. In addition, examples of the medium include solutions and gases, examples of the solutions include water; buffer solutions and electrolyte solutions such as strong electrolyte solutions, and examples of the gases include inert gases such as nitrogen gas and helium gas.

Although not particularly limited, the method for manufacturing the sensor of the present disclosure as well as the intensifying sensor chip including the prism 1 and the sensor chip is preferably a method for sequentially forming and stacking on the prism 1 the transparent electrode 2, the n-type transparent semiconductor film 3, and the plasmon resonance film electrode film 4 in this order. Although the formation method is not particularly limited, examples of the method for forming the transparent electrode 2, the n-type transparent semiconductor film 3, and the plasmon resonance film electrode film 4 include each independently the sputtering method, the ion plating method, the electron beam vapor deposition method, the vacuum vapor deposition method, the chemical vapor deposition method, and the plating method. Additionally, in the method for manufacturing a sensor, no limitation is imposed on the method for electrically connecting the transparent electrode 2 and the plasmon resonance film electrode 4 of the sensor chip to the electric measuring apparatus via external circuits, and the connection is possible by appropriately employing a conventionally known method.

EXAMPLES

Hereinafter, the examples and comparative examples are described more specifically, but the present invention is not limited to the following examples.

Comparative Example 1

Prepared first was an ITO (indium tin oxide) substrate having a transparent electrode made of ITO film formed on one surface of a glass substrate (glass substrate: TEMPAX, thickness of the glass substrate: 1.1 mm, area: 19×19 mm, ITO film: highly durable transparent conductive film of 5Ω, manufactured by GEOMATEC Co., Ltd.). Next, a sputtering apparatus (QAM-4, manufactured by ULVAC, Inc.) was used to form a film made of $TiO_2$ ($TiO_2$ film) having a thickness of 200 nm on the ITO film by use of $TiO_2$ (Titanium Dioxide, 99.9%, manufactured by Furuuchi Chemical Corporation) as the target. Next, a film made of Au (Au film) having a thickness of 50 nm was formed on the $TiO_2$ film using the sputtering apparatus and using Au (99.99%, manufactured by Kojundo Chemical Laboratory Co., Ltd.) as the target to obtain a chip formed by stacking the glass substrate, the ITO film, the $TiO_2$ film, and the Au film in this order.

Example 1

Figure 7:
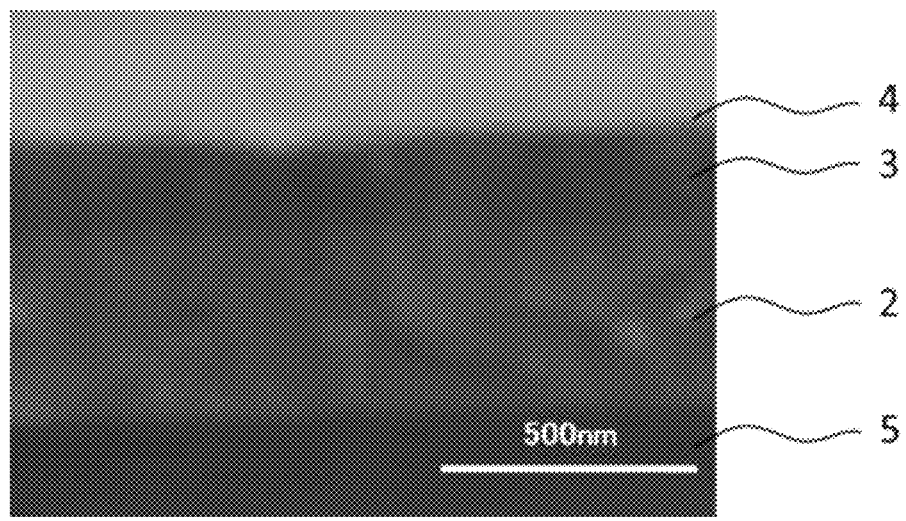
FIG. 7 is a scanning electron micrograph of a longitudinal cross-section of a chip obtained in Example 1.

A chip (photoelectric conversion unit (sensor chip)) formed by stacking the glass substrate, the ITO film, the $TiO_2$ film, and the Au film in this order was obtained in the same manner as that of Comparative Example 1. Next, the surface of the glass substrate of the obtained element opposite to the ITO film was coated with 1.5 µL of 80% glycerol and was brought into close contact with the inclined face of the right-angled prism (BK-7 Right-Angled Prism PS908, isosceles right triangle, manufactured by Thorlabs, Inc., refractive index: 1.51) to obtain a chip formed by stacking the prism, the glycerol, the glass substrate, the ITO film, the $TiO_2$ film, and the Au film in this order (prism-attached chip). FIG. 7 illustrates a scanning electron micrograph obtained by observing a longitudinal cross-section of the chip obtained in Example 1 (the glass substrate (the transparent substrate 5), the ITO film (the transparent electrode 2), the $TiO_2$ film (the n-type transparent semiconductor film 3), and the Au film (the plasmon resonance film electrode 4)) with a scanning electron microscope (S-3400N, manufactured by Hitachi, Ltd.).

Test Example 1

Figure 8:
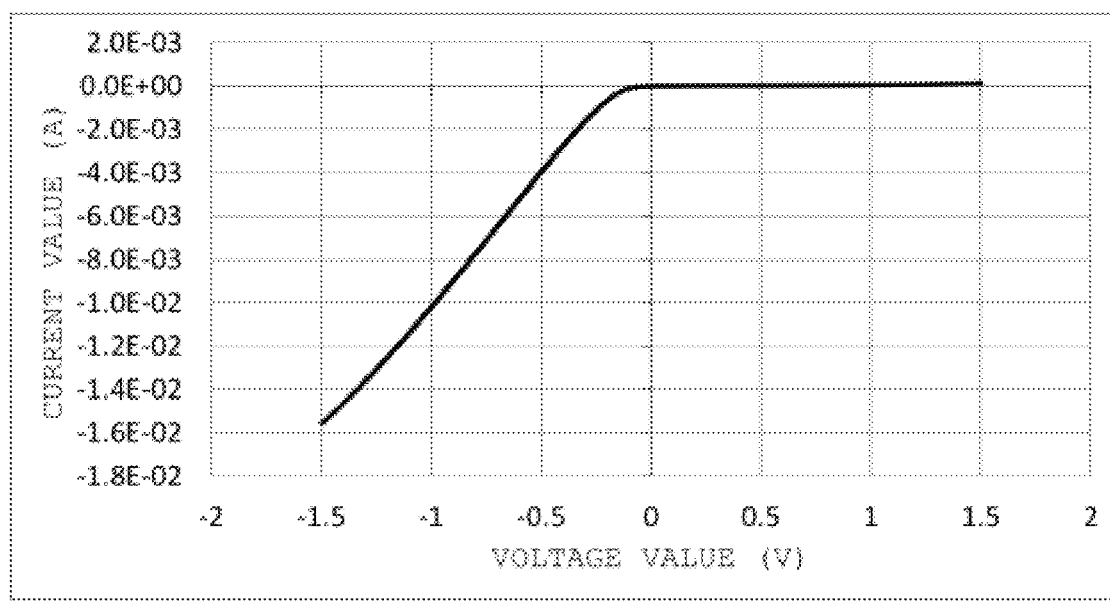
FIG. 8 is a graph illustrating the relationship between the voltage value and the current value obtained by carrying out Test Example 1 on the chip obtained in Example 1.

The chip obtained in Example 1 was confirmed to have a Schottky barrier formed between the $TiO_2$ film and the Au film. Specifically, first, electrical connection was established with conductive wire between the ITO film of the chip obtained in Example 1 and the working electrode of a semiconductor device analyzer (Semiconductor Device Analyzer B1500A, manufactured by Keysight Technologies) and between the Au film and the counter electrode and the reference electrode of the semiconductor device analyzer. Next, a voltage was applied between the electrodes in the range of −1.5 V to +1.5 V to measure the current value (A) between the ITO film and the Au film. FIG. 8 illustrates the results obtained for Example 1 (the applied voltage (Voltage Value (V)) and the current value (Current Value (A)) between the ITO film and the Au film).

As is apparent from the results illustrated in FIG. 8, in the chip (Example 1), the current value changed by 15 mA or more at −1.5 V or more and less than 0 V, whereas the absolute value of the current value was less than 0.2 mA at 0 V or more and +1.5 V or less, meaning that a Schottky barrier was formed between the $TiO_2$ film and the Au film. In addition, Comparative Example 1 was also confirmed to have a Schottky barrier formed between the $TiO_2$ film and the Au film.

Test Example 2

Electrical connection was established with conductive wire between the ITO film of each of the chips obtained in Example 1 and Comparative Example 1 and the working electrode of a current measuring device (Electrochemical Analyzer Model 802D, manufactured by ALS/CH Instruments Inc.) and between the Au film and the counter electrode and the reference electrode of the current measuring device.

Figure 9A:
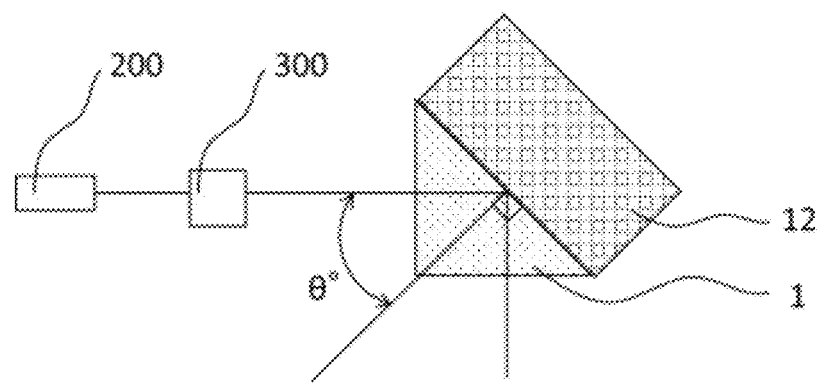
FIG. 9A is a schematic diagram illustrating a current measuring method of Test Example 2 for the chip obtained in Example 1.
Figure 9B:
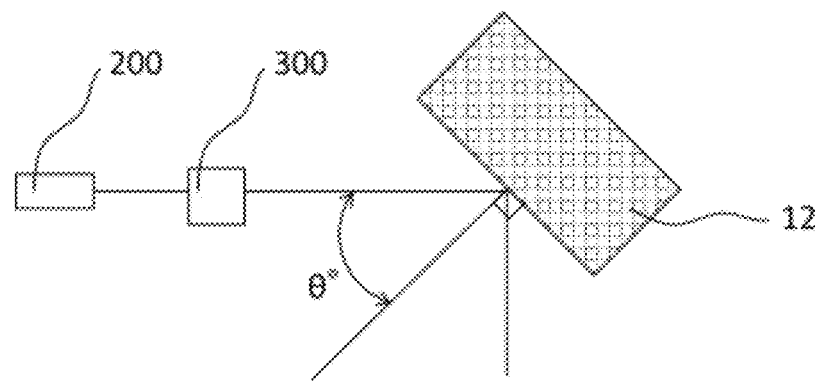
FIG. 9B is a schematic diagram illustrating a current measuring method of Test Example 2 for the chip obtained in Comparative Example 1.
Figure 10:
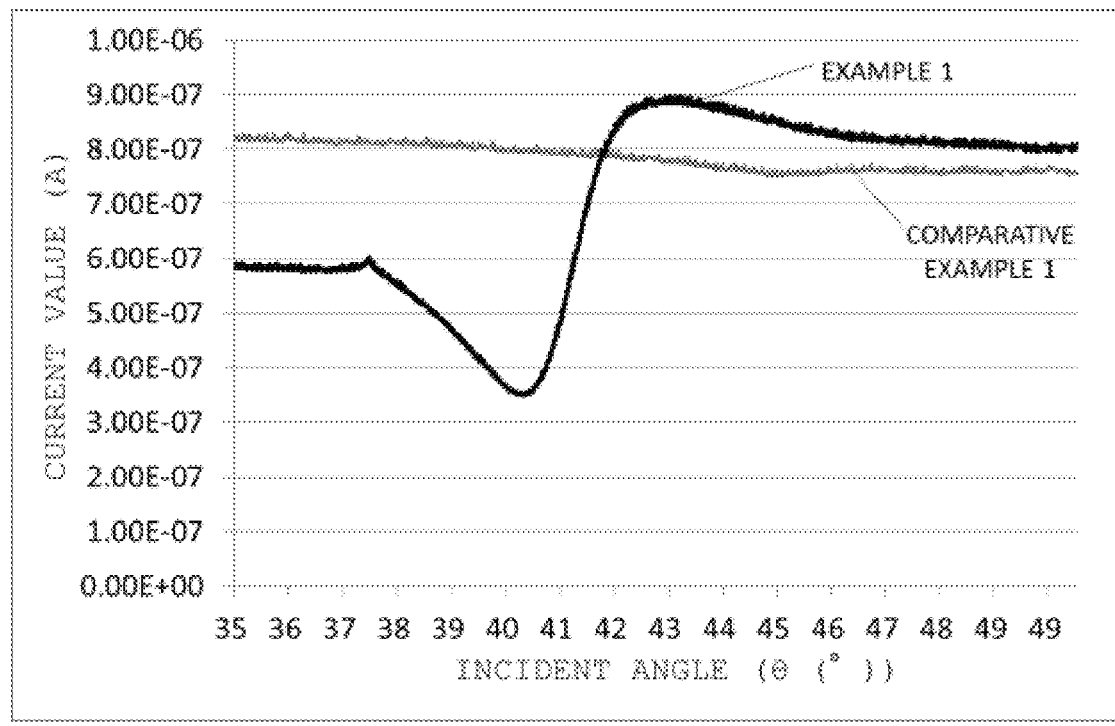
FIG. 10 is a graph illustrating the relationship between the incident angle and the current value obtained by carrying out Test Example 2 on the chips obtained in Example 1 and Comparative Example 1.

Next, laser light of 675 nm of a semiconductor laser (light source 200, SlFC675, manufactured by Thorlabs, Inc.) was allowed to pass through a polarizer (polarizer 300, CMM1-PBS251/M, manufactured by Thorlabs, Inc.) for conversion into p-polarized laser light, and its intensity was measured with a power meter (Model 843-R, manufactured by Newport Corporation) for adjustment to 1.2 mW. Next, as illustrated in FIG. 9A for Example 1 and in FIG. 9B for Comparative Example 1, the p-polarized laser light (1.2 mW) was emitted onto the prism side of the photoelectric conversion unit (sensor chip 12) of the obtained chip (FIG. 9A) or onto the glass substrate surface opposite to the ITO film (FIG. 9B). The incident angle (θ(°)) of the p-polarized laser light (incident light) to the glass substrate surface was changed between 35° to 50° to measure the current value (A) between the ITO film and the Au film for various incident angles. FIG. 10 illustrates the results (graph illustrating the relationship between the incident angle (θ(°)) and the current value (Current Value (A)) between the ITO film and the Au film).

As is apparent from the results illustrated in FIG. 10, in the chip including a prism (Example 1), the current value was confirmed to change when the incident angle of the laser light entering the prism was in a specific range (37 to 43° in FIG. 10). The present inventors presume the reason as follows. When the laser light was allowed to pass through the prism, the incident light totally reflected at the interface between the $TiO_2$ film and the Au film at a specific incident angle or more to produce evanescent waves, and the surface plasmon polaritons thus excited caused a change in current produced due to the change in electric field in the Au film placed in the vicinity of the $TiO_2$ film, and moreover, the intensity of the surface plasmon polaritons which caused this change was changed by the incident angle.

Test Example 3

The chip obtained in Example 1 was confirmed to function as a sensor chip. Specifically, first, a sample chamber was placed to come into contact with the surface of the Au film of the chip obtained in Example 1 (the surface opposite to the $TiO_2$ film), and the sample chamber was filled with ultrapure water. In addition, in the same manner as that of Test Example 2, electrical connection was established with conductive wire between the ITO film of the chip obtained in Example 1 and the working electrode of the current measuring device and between the Au film and the counter electrode and the reference electrode of the current measuring device.

Figure 11:
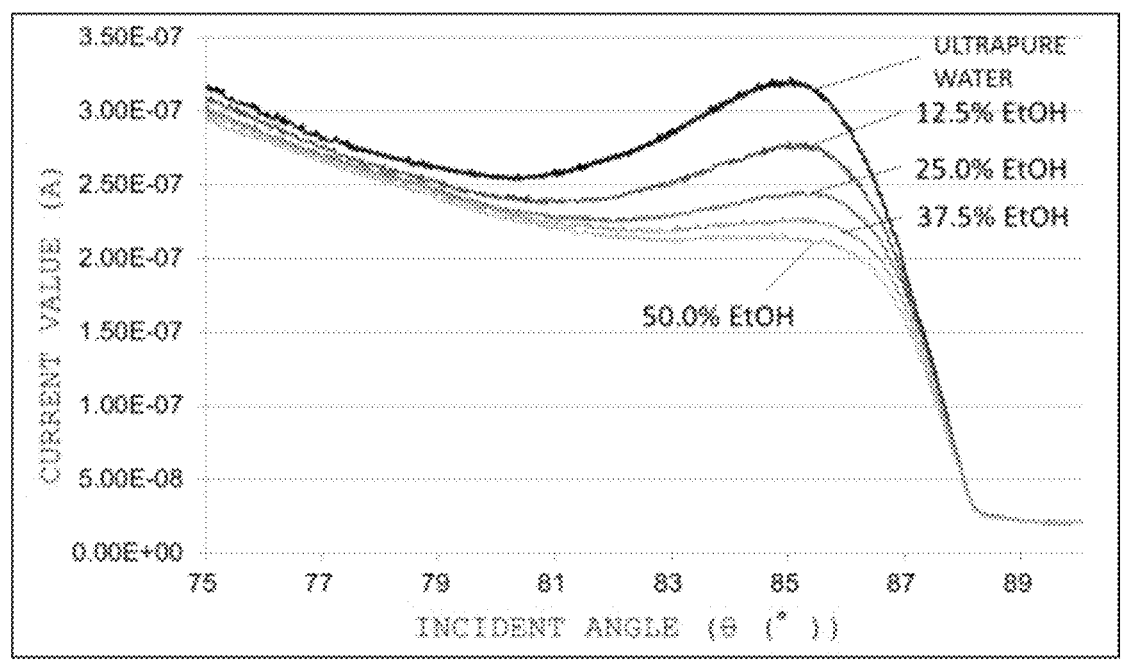
FIG. 11 is a graph illustrating the relationship between the incident angle and the current value obtained by carrying out Test Example 3 on the chip obtained in Example 1, given for various solutions.
Figure 12:
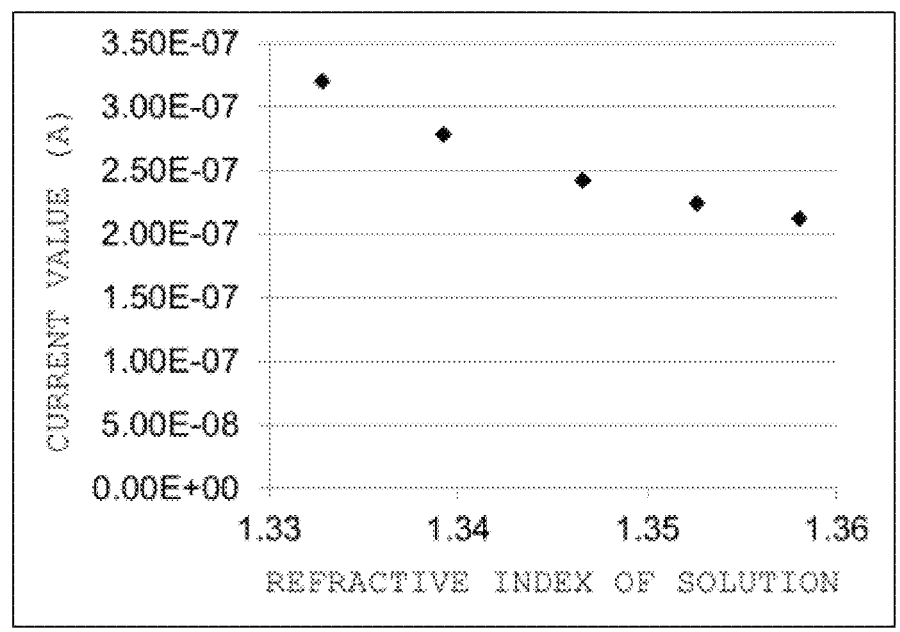
FIG. 12 is a graph illustrating the relationship between the current value and the refractive index of the solution obtained by carrying out Test Example 3 on the chip obtained in Example 1.

Next, in the same manner as that of Test Example 2, the p-polarized laser light adjusted to have an intensity of 1.2 mW was emitted onto the prism of the photoelectric conversion unit (sensor chip 12) of the obtained chip. The incident angle (θ(°)) of the p-polarized laser light (incident light) to the glass substrate surface was changed between 75° to 90° to measure the current value (A) between the ITO film and the Au film for various incident angles. In addition, the current value (A) between the ITO film and the Au film for various incident angles was measured in the same manner as above except that the solution used was 12.5% ethanol (EtOH), 25.0% ethanol, 37.5% ethanol, or 50.0% ethanol instead of the ultrapure water. FIG. 11 illustrates the results (graph illustrating the relationship between the incident angle (θ(°)) and the current value (Current Value (A)) between the ITO film and the Au film for various solutions). Additionally, Table 1 illustrates the refractive indices at 22.1° C. of the solutions. Moreover, FIG. 12 illustrates the relationship between the refractive indices of the solutions and the current value (current value (A)) between the ITO film and the Au film measured at an incident angle of 85°.

TABLE 1

| | Refractive Index of Solution (22.1° C.) |
|---|---|
| Ultrapure Water | 1.3328 |
| 12.5% Ethanol | 1.3392 |
| 25.0% Ethanol | 1.3466 |
| 37.5% Ethanol | 1.3526 |
| 50.0% Ethanol | 1.3580 |

As is apparent from the results illustrated in FIG. 11, in the intensifying sensor chip including a prism and a sensor chip (Example 1), the amount of change in current value was confirmed to increase particularly when the incident angle ($\theta°$) of the light entering the prism was between 79° to 85° if the solution was in contact with the Au film. Note that in FIG. 11, the incident angle ($\theta°$) at which a change in current value is observed is different from that in Test Example 2 (FIG. 10). The present inventors presume that this is because the incident angle for producing the surface plasmon polaritons changed when the aqueous solution was brought into contact with the Au film surface. Moreover, as illustrated in Table 1 and FIG. 12, the current value was confirmed to change depending on the refractive index of the solution. The present inventors presume the reason as follows. While the amount of current produced due to the change in electric field in the Au film placed in the vicinity of the $TiO_2$ film changed due to the surface plasmon polaritons produced by the total reflection of the incident light caused by use of the prism at the interface between the $TiO_2$ film and the Au film, the intensity of the surface plasmon polaritons which caused this change was changed depending on the refractive index of the solution. As a result, the amount of current was changed. Therefore, it was confirmed that use of the intensifying sensor chip of Example 1 made it possible to measure with sufficient accuracy the change in refractive index of the sample in the vicinity of the Au film. Since the refractive index generally corresponds to the concentration or state of the sample having the refractive index, it was confirmed that the sensor chip of Example 1 and the sensor using the sensor chip and a prism in combination had sufficient accuracy as a sensor chip and a sensor capable of measuring the concentration change and state change of the sample.

Example 2

A chip (prism-attached chip) formed by stacking a prism, diiodomethane, a glass substrate, an ITO film, a $TiO_2$ film, and an Au film (thickness: 50 nm) in this order was obtained in the same manner as that of Example 1 except that right-angled prism S-TIH11 (manufactured by OHARA Inc., refractive index: 1.77) was used instead of BK-7 Right-Angled Prism and 0.5 μL of diiodomethane (first grade, manufactured by FUJIFILM Wako Pure Chemical Corporation) was coated instead of 1.5 μL of 80% glycerol.

Example 3

A chip (prism-attached chip) formed by stacking a prism, diiodomethane, a glass substrate, an ITO film, a $TiO_2$ film, and an Au film (thickness: 30 nm) in this order was obtained in the same manner as that of Example 2 except that the thickness of the Au film was changed to 30 nm in the chip (photoelectric conversion unit (sensor chip)) formed by stacking a glass substrate, an ITO film, a $TiO_2$ film, and an Au film in this order.

Test Example 4

For the chips obtained in Example 2 and Example 3, measurement was carried out in the same manner as that of Test Example 3 on the current value between the ITO film and the Au film at various incident angles of the incident light. Specifically, first, a sample chamber was placed to come into contact with the surface of the Au film of the chip obtained in each example (the surface opposite to the $TiO_2$ film), and the sample chamber was filled with ultrapure water. In addition, in the same manner as that of Test Example 2, electrical connection was established with conductive wire between the ITO film of the chip obtained in each example and the working electrode of the current measuring device and between the Au film and the counter electrode and the reference electrode of the current measuring device.

Figure 13:
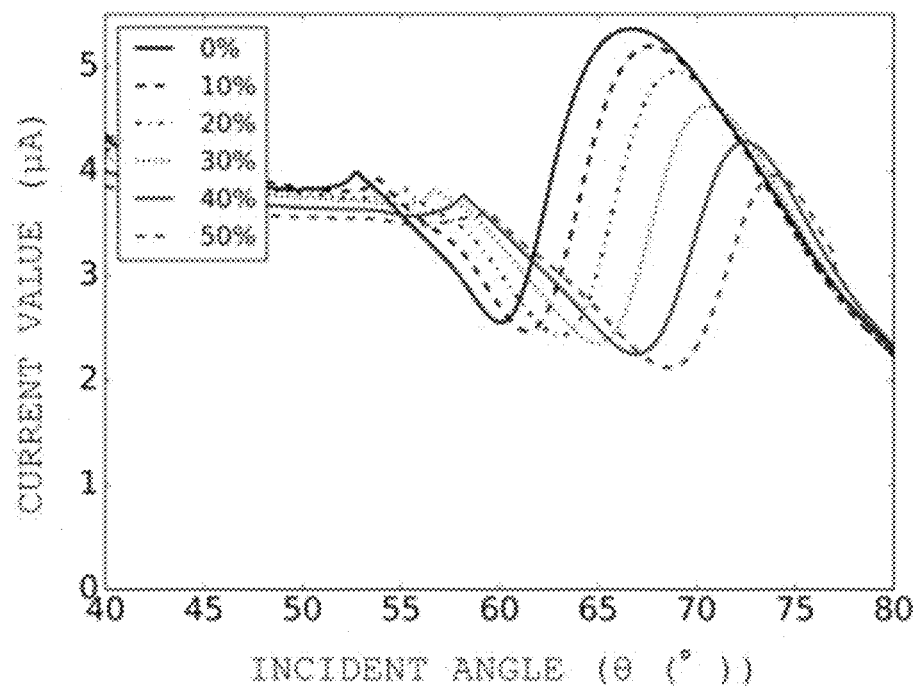
FIG. 13 is a graph illustrating the relationship between the current value and the refractive index of the solution obtained by carrying out Test Example 4 on the chip obtained in Example 2.

Next, laser light of 670 nm of a semiconductor laser (light source, CPS670, manufactured by Thorlabs, Inc.) was allowed to pass through a polarizer (CMM1-PBS251/M, manufactured by Thorlabs, Inc.) for conversion into p-polarized laser light, and its intensity was measured with a power meter (Model 843-R, manufactured by Newport Corporation) for adjustment to 4.0 mW. Next, in the same manner as that of Test Example 2, the p-polarized laser light (incident light) was emitted onto the prism of the obtained chip, and the incident angle ($\theta°$) of the incident light to the glass substrate surface was changed between 40° to 80° to measure the current value (μA) between the ITO film and the Au film for various incident angles. In addition, the current value (μA) between the ITO film and the Au film for various incident angles was measured in the same manner as above except that the solution used was 10% glycerol, 20% glycerol, 30% glycerol, 40% glycerol, or 50% glycerol instead of the ultrapure water. FIG. 13 (Example 2) and FIG. 14 (Example 3) illustrate the results (graph illustrating the relationship between the incident angle ($\theta(°)$) and the current value (Current Value (μA)) between the ITO film and the Au film for various solutions). Additionally, Table 2 illustrates the refractive indices at 22.0° C. of the solutions. Moreover, FIG. 15 illustrates the relationship between the refractive indices of the solutions and the current value (Current Value (μA)) between the ITO film and the Au film measured at an incident angle of 66.5° (Example 2) or 68.6° (Example 3).

TABLE 2

|  | Refractive Index of Solution (22.0° C.) |
|---|---|
| Ultrapure Water | 1.3327 |
| 10% Glycerol | 1.3455 |
| 20% Glycerol | 1.3616 |
| 30% Glycerol | 1.3760 |
| 40% Glycerol | 1.3923 |
| 50% Glycerol | 1.4044 |

Figure 14:
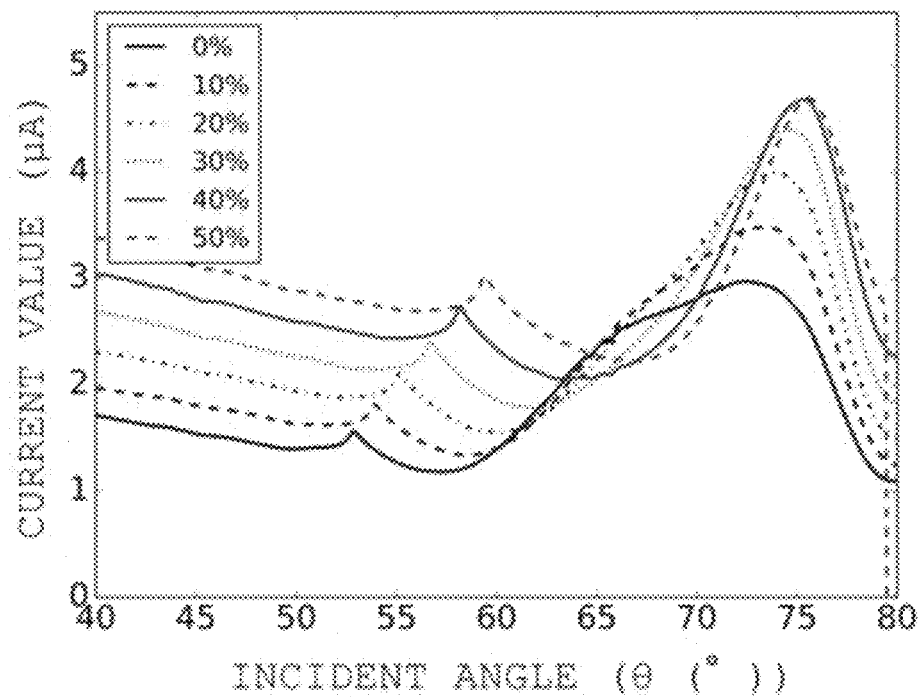
FIG. 14 is a graph illustrating the relationship between the current value and the refractive index of the solution obtained by carrying out Test Example 4 on the chip obtained in Example 3.
Figure 15:
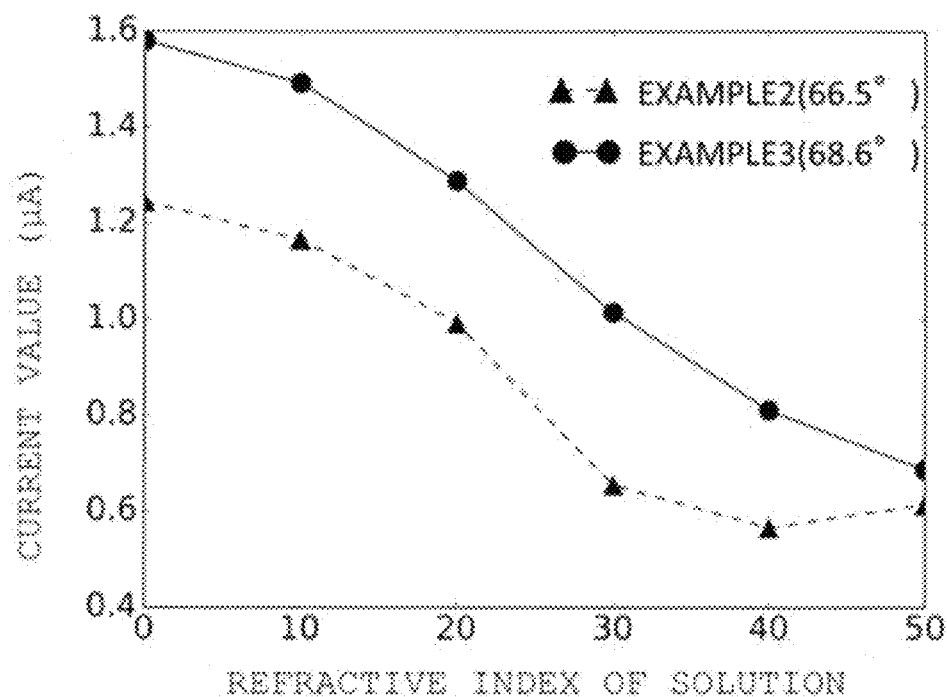
FIG. 15 is a graph illustrating the relationship between the current value and the refractive index of the solution obtained by carrying out Test Example 4 on the chips obtained in Example 2 and Example 3.

As is apparent from the results illustrated in FIG. 13 and FIG. 14, the intensifying sensor chip including a prism and a sensor chip was confirmed to have sufficient accuracy as a sensor chip capable of measuring the concentration change and state change of the sample even when the thickness of the Au film was 50 nm or 30 nm or when diiodomethane was used as an intermediate layer between the prism and the glass substrate. Moreover, as is apparent from the result illustrated in FIG. 15, the change in the current value with respect to the change in the incident angle of light ($\theta°$) became gentle particularly in the case where the Au film was 30 nm (Example 3) as compared with the case of 50 nm (Example 2), and it was confirmed that highly accurate measurement was possible to a glycerol concentration of 50% (refractive index: about 1.40).

INDUSTRIAL APPLICABILITY

As described above, an electricity measuring type surface plasmon resonance sensor of the present disclosure and a sensor chip used in the same make it possible to provide an electricity measuring type surface plasmon resonance sensor having a sufficient sensor accuracy and a sensor chip used in the same. In addition, the sensor and the sensor chip of the present disclosure can detect surface plasmon polaritons as an electric signal, and thus can be downsized and can achieve a higher throughput. Moreover, the sensor and the sensor chip of the present disclosure do not affect the sample and thus make it possible to carry out more accurate measurement. Therefore, the sensor and the sensor chip of the present disclosure are very useful in future development of medical, food, and environmental technology.

REFERENCE SIGNS LIST

1: prism
2: transparent electrode
3: n-type transparent semiconductor film
4: plasmon resonance film electrode
5: transparent substrate
6: adhesive layer
7: protection film
8: sample chamber
11, 12, 13: sensor chip (photoelectric conversion unit)
21: electric measuring apparatus
31, 31': external circuit
110: intensifying sensor chip (Embodiment 1)
120: intensifying sensor chip (Embodiment 2)
130: intensifying sensor chip (Embodiment 3)
140: intensifying sensor chip (Embodiment 4)
150: intensifying sensor chip (Embodiment 5)
200: light source
300: polarizer
400: incident light
510: sensor (Embodiment 1)

The invention claimed is:

1. An electricity measuring type surface plasmon resonance sensor comprising:
a plasmon polariton intensifying sensor chip in which a prism and a sensor chip including a transparent electrode, an n-type transparent semiconductor film, and a plasmon resonance film electrode arranged in this order are arranged in an order of the prism, the transparent electrode, the n-type transparent semiconductor film, and the plasmon resonance film electrode; and
an electric measuring apparatus which directly measures a current or voltage from the transparent electrode and the plasmon resonance film electrode, wherein
the prism is capable of controlling an angle of an incident light so as to allow the incident light to totally reflect between the plasmon resonance film electrode and the n-type transparent semiconductor film.

2. The electricity measuring type surface plasmon resonance sensor according to claim 1, wherein
in the sensor chip, a combination of the n-type transparent semiconductor film and the plasmon resonance film electrode is a combination which forms a Schottky barrier.

3. The electricity measuring type surface plasmon resonance sensor according to claim 1, wherein
in the sensor chip, a thickness of the plasmon resonance film electrode is 200 nm or less (not including 0).

4. The electricity measuring type surface plasmon resonance sensor according to claim 1, wherein
in the sensor chip, the n-type transparent semiconductor film is a film made of at least one n-type semiconductor selected from the group consisting of $TiO_2$, $ZnO$, $SnO_2$, $SrTiO_3$, $Fe_2O_3$, $TaON$, $WO_3$, and $In_2O_3$.

5. The electricity measuring type surface plasmon resonance sensor according to claim 1, wherein
the sensor chip further includes an adhesive layer between the n-type transparent semiconductor film and the plasmon resonance film electrode.

6. The electricity measuring type surface plasmon resonance sensor according to claim 1, wherein
the sensor chip further includes a protection film on a surface of the plasmon resonance film electrode opposite to the n-type transparent semiconductor film.

7. An electricity measuring type surface plasmon resonance sensor comprising:
a plasmon polariton intensifying sensor chip which includes
a sensor chip provided with
a plasmon resonance film electrode which is capable of converting incident light into a surface plasmon polariton,
an n-type transparent semiconductor film which is arranged on an incident light side of the plasmon resonance film electrode, which transmits the incident light, and which is capable of receiving hot electrons emitted from the plasmon resonance film electrode when the transmitted incident light interacts with the plasmon resonance film electrode, and
a transparent electrode which is capable of picking up as an electric signal the hot electrons transferred from the n-type transparent semiconductor film and
a prism capable of controlling an angle of the incident light so as to allow the incident light to totally reflect between the plasmon resonance film electrode and the n-type transparent semiconductor film; and
an electric measuring apparatus which is capable of directly measuring a current or voltage from the transparent electrode and the plasmon resonance film electrode.

8. An electricity measuring type surface plasmon resonance sensor chip which is used in the electricity measuring type surface plasmon resonance sensor according to claim 1 and which includes the transparent electrode, the n-type transparent semiconductor film, and the plasmon resonance film electrode arranged in this order.

9. An electricity measuring type surface plasmon resonance sensor chip which is used in the electricity measuring type surface plasmon resonance sensor according to claim 7 and which includes the transparent electrode, the n-type transparent semiconductor film, and the plasmon resonance film electrode arranged in this order.

10. A method for detecting a change in a surface plasmon polariton using an electricity measuring type surface plasmon resonance sensor which includes
a plasmon polariton intensifying sensor chip in which a prism and a sensor chip including a transparent electrode, an n-type transparent semiconductor film, and a plasmon resonance film electrode arranged in this order are arranged in an order of the prism, the transparent electrode, the n-type transparent semiconductor film, and the plasmon resonance film electrode, and
an electric measuring apparatus which directly measures a current or voltage from the transparent electrode and the plasmon resonance film electrode, the method comprising:

producing a surface plasmon polariton by emitting light onto the prism and allowing the light, which has passed through the prism, the transparent electrode, and the n-type transparent semiconductor, to totally reflect between the plasmon resonance film electrode and the n-type transparent semiconductor film to interact with the plasmon resonance film electrode;

picking up hot electrons, produced by the surface plasmon polariton and transferred to the n-type transparent semiconductor film, from the transparent electrode as an electric signal; and measuring a change in current or voltage between the transparent electrode and the plasmon resonance film electrode with the electric measuring apparatus.

* * * * *